United States Patent
Leveridge et al.

(10) Patent No.: US 8,860,412 B2
(45) Date of Patent: Oct. 14, 2014

(54) METHODS AND SYSTEMS FOR MEASURING NMR CHARACTERISTICS IN PRODUCTION LOGGING

(75) Inventors: Robert M. Leveridge, Worcester Park (GB); Reza Taherian, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 448 days.

(21) Appl. No.: 13/192,460

(22) Filed: Jul. 28, 2011

(65) Prior Publication Data

US 2012/0049844 A1    Mar. 1, 2012

Related U.S. Application Data

(60) Provisional application No. 61/378,678, filed on Aug. 31, 2010, provisional application No. 61/378,687, filed on Aug. 31, 2010, provisional application No. 61/378,691, filed on Aug. 31, 2010.

(51) Int. Cl.
*G01V 3/00* (2006.01)
*G01V 3/32* (2006.01)
*G01R 33/30* (2006.01)

(52) U.S. Cl.
CPC .............. *G01V 3/32* (2013.01); *G01R 33/302* (2013.01)
USPC ........................................ 324/303

(58) Field of Classification Search
USPC ................................. 324/300–322
See application file for complete search history.

(56) References Cited

U.S. PATENT DOCUMENTS

| | | | | |
|---|---|---|---|---|
| 4,792,757 A * | 12/1988 | Vail et al. | | 324/303 |
| 5,959,453 A * | 9/1999 | Taicher et al. | | 324/303 |
| 6,179,066 B1 * | 1/2001 | Nasr et al. | | 175/45 |
| 6,232,778 B1 | 5/2001 | Speier et al. | | |
| 6,720,765 B2 * | 4/2004 | Edwards et al. | | 324/303 |
| 7,012,426 B2 * | 3/2006 | Edwards et al. | | 324/303 |
| 7,066,284 B2 * | 6/2006 | Wylie et al. | | 175/65 |
| 7,185,715 B2 * | 3/2007 | Krueger et al. | | 175/40 |
| 7,225,879 B2 * | 6/2007 | Wylie et al. | | 166/380 |
| 7,295,005 B2 * | 11/2007 | Edwards | | 324/303 |
| 7,341,117 B2 * | 3/2008 | Wylie et al. | | 175/72 |
| 7,532,007 B2 * | 5/2009 | Song et al. | | 324/303 |
| 7,571,777 B2 * | 8/2009 | Wylie et al. | | 175/50 |
| 8,011,446 B2 * | 9/2011 | Wylie et al. | | 175/22 |
| 2005/0223790 A1 | 10/2005 | Engels et al. | | |
| 2009/0219019 A1 | 9/2009 | Taherian et al. | | |

FOREIGN PATENT DOCUMENTS

| | | |
|---|---|---|
| GB | 2333308 A | 7/1999 |
| GB | 2334982 A | 9/1999 |
| WO | 02/097475 A1 | 12/2002 |
| WO | 2006/079103 A2 | 7/2006 |
| WO | 2007/130516 A2 | 11/2007 |
| WO | 2007/143384 A2 | 12/2007 |

OTHER PUBLICATIONS

Combined and Examination Report issued in GB1114793.1 on Jan. 13, 2012, 8 pages.

* cited by examiner

*Primary Examiner* — Dixomara Vargas
(74) *Attorney, Agent, or Firm* — Kimberly Ballew

(57) ABSTRACT

Methods and systems for measuring nuclear magnetic resonance characteristics of formation fluid utilizing micro-NMR sensors are provided. The micro-NMR sensors can be used to analyze fluid flowing through the wellbore on a periodic, continuous, and/or batch-mode basis. More efficient sampling and analysis can be conducted using the micro-NMR sensors. In situ analysis and time-lapse logging are also enabled.

16 Claims, 11 Drawing Sheets

METHODS AND SYSTEMS FOR MEASURING NMR CHARACTERISTICS IN PRODUCTION LOGGING

CROSS-REFERENCE TO RELATED APPLICATIONS

This application claims priority to U.S. Provisional Patent Application Nos. 61/378,678, 61/378,687, and 61/378,691, each titled "METHODS AND SYSTEMS FOR MEASURING NMR CHARACTERISTICS OF RESERVOIR FLUIDS WITH MICRO-NMR," and each filed on Aug. 31, 2010, the entire disclosures of which are hereby incorporated by reference herein.

STATEMENT REGARDING FEDERALLY SPONSORED RESEARCH OR DEVELOPMENT

Not applicable.

BACKGROUND OF THE INVENTION

1. Field of the Invention

The invention relates generally to the field of obtaining nuclear magnetic resonance (NMR) measurements from fluids. More specifically, the invention relates to the use of micro-NMR devices to obtain downhole NMR measurements.

2. Background Art

Nuclear magnetic resonance (NMR) can be used to determine various characteristics of subsurface formations and/or samples. Conventional NMR logging tools can be used downhole to obtain these characteristics, which then can be used to assist in the determination of, for example, the presence, absence, and/or location of hydrocarbons in a given formation or sample. Conventional NMR logging, well known in the art, generally involves deploying in a wellbore an NMR instrument, which uses a DC magnetic field to polarize Hydrogen nuclei (essentially protons) and an antenna to generate RF pulses and detect various RF signals from nuclei in a formation or sample. Certain exemplary NMR techniques are described in U.S. Pat. No. 6,232,778 assigned to Schlumberger Technology Corp., the entire disclosure of which is hereby incorporated by reference.

NMR measurements, in general, are accomplished by causing the magnetic moments of nuclei in a formation to precess about an axis. The axis about which the nuclei precess may be established by applying a strong, polarizing, static magnetic field $B_0$ to the formation, such as through the use of permanent magnets. This field causes the proton spins to align in a direction parallel to the applied field (this step, which is sometimes referred to as the creation of longitudinal magnetization, results in the nuclei being "polarized"). Polarization does not occur immediately, but instead grows exponentially in accordance with a time constant $T_1$, and may take as long as several seconds to occur. After sufficient time, a thermal equilibrium polarization parallel to $B_0$ is established.

Next, a series of radio frequency (RF) pulses are produced so that an oscillating magnetic field, $B_1$, is applied. The first RF pulse (referred to as the 90-degree or tipping pulse) rotates the magnetization from $B_0$ direction substantially into the transverse plane (i.e., transverse magnetization). Additional RF pulses (often referred to as 180-degree or refocusing pulses) are applied to create a series of spin echoes. The frequency of the RF pulses is chosen to excite specific nuclear spins of a particular region of the sample that is being investigated.

Two time constants are associated with the relaxation processes of the longitudinal and transverse magnetization: $T_1$ and $T_2$. The spin-lattice relaxation time ($T_1$) is the time constant for longitudinal magnetization to return to its thermal equilibrium value in the static magnetic field. The spin-spin relaxation time ($T_2$) is the time constant for the transverse magnetization to return to its thermal equilibrium value which is zero. The spin echo intensity versus time, collected by conventional NMR logging tools, is normally decomposed and then displayed in relaxation or $T_2$ space. Various conventional methods exist for decomposing spin echoes to be displayed in $T_2$ space.

Recently, micro-NMR devices have been developed that utilize many of the same principles of conventional NMR logging tools. These micro-NMR devices can be used in surface and downhole applications, as described in U.S. Published Patent Application No. 20090219019 (assigned to Schlumberger Technology Corporation), the entire disclosure of which is hereby incorporated by reference. An example micro-NMR device can be micro fabricated on a millimeter or sub-millimeter scale, and consist of a sample tube surrounded by an antenna that works as transmitter and as receiver. Moreover, micro-NMR devices can be made very small and a correspondingly low power utilization. However, the teaching of the present disclosure is not limited to the particular micro-NMR devices disclosed herein; rather, any suitable micro-NMR devices that can be fit in the borehole can serve this purpose.

Various needs in the art exist for systems that incorporate micro-NMR devices to analyze formations, samples, and/or the fluids therein. The present disclosure describes various systems and methods for utilizing micro-NMR devices in various applications.

DETAILED DESCRIPTION

The invention provides various systems and methods for utilizing micro-NMR devices to obtain NMR measurements in downhole applications. Methods and systems for utilizing micro-NMR devices to obtain NMR measurements in production logging will now be described with reference to FIGS. 1-13, which depict representative or illustrative embodiments of the invention.

Figure 1:
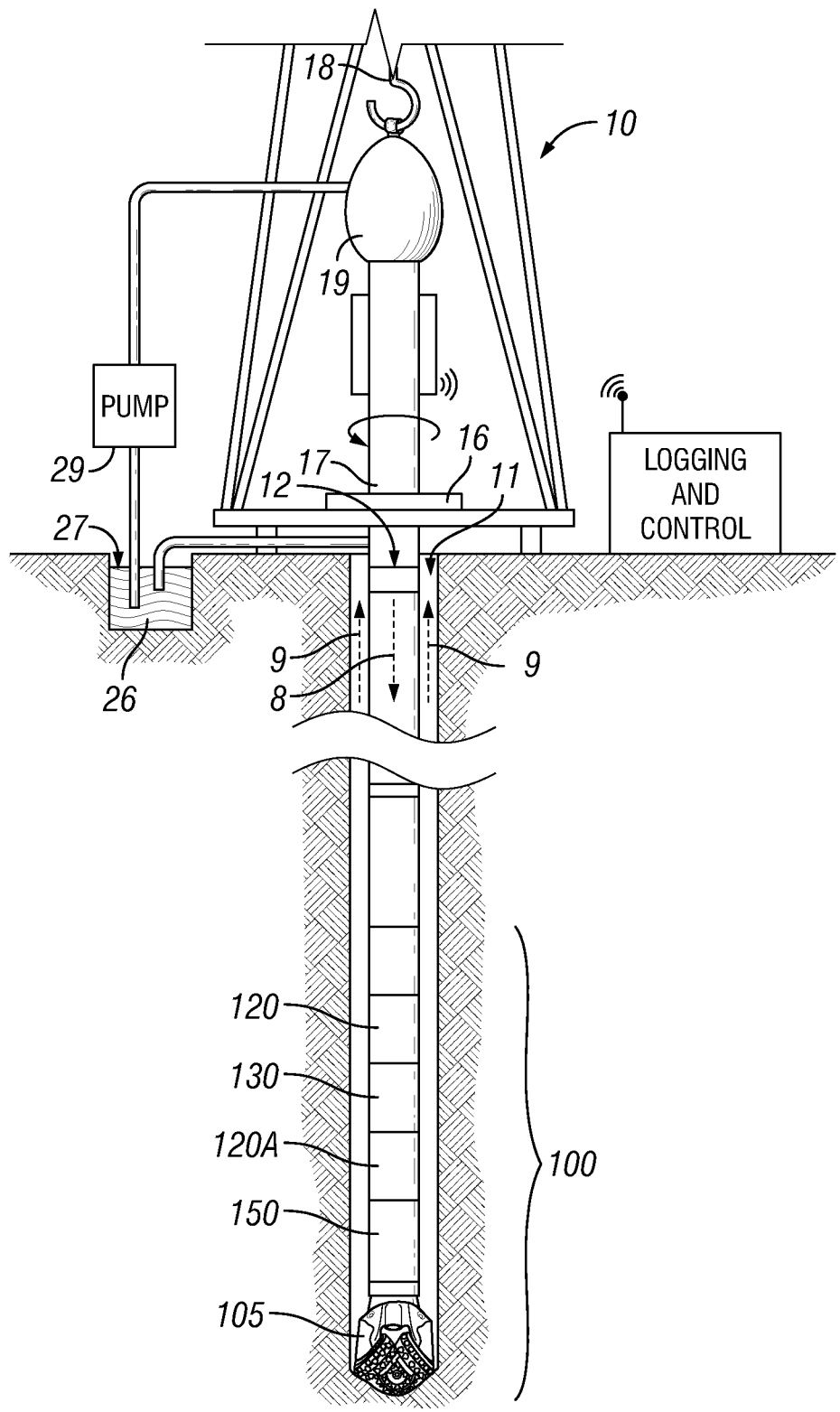
FIG. 1 illustrates a wellsite system in which the present invention can be employed, according to an exemplary embodiment.

FIG. 1 illustrates a wellsite system in which the present invention can be employed. The wellsite can be onshore or offshore. In this exemplary system, a borehole 11 is formed in subsurface formations 106 by rotary drilling in a manner that is well known in the art. Embodiments of the invention can also use directional drilling, as will be described hereinafter.

A drill string 12 is suspended within the borehole 11 and has a bottom hole assembly 100 which includes a drill bit 105 at its lower end. The surface system includes platform and derrick assembly 10 positioned over the borehole 11, the assembly 10 including a rotary table 16, kelly 17, hook 18 and rotary swivel 19. The drill string 12 is rotated by the rotary table 16, energized by means not shown, which engages the kelly 17 at the upper end of the drill string. The drill string 12 is suspended from a hook 18, attached to a travelling block (also not shown), through the kelly 17 and a rotary swivel 19 which permits rotation of the drill string relative to the hook. As is well known, a top drive system could alternatively be used.

In the example of this embodiment, the surface system further includes drilling fluid or mud 26 stored in a pit 27 formed at the well site. A pump 29 delivers the drilling fluid 26 to the interior of the drill string 12 via a port in the swivel 19, causing the drilling fluid to flow downwardly through the drill string 12 as indicated by the directional arrow 8. The drilling fluid exits the drill string 12 via ports in the drill bit 105, and then circulates upwardly through the annulus region between the outside of the drill string and the wall of the borehole 11, as indicated by the directional arrows 9. In this well known manner, the drilling fluid lubricates the drill bit 105 and carries formation 106 cuttings up to the surface as it is returned to the pit 27 for recirculation.

In various embodiments, the systems and methods disclosed herein can be used with any means of conveyance known to those of ordinary skill in the art. For example, the systems and methods disclosed herein can be used with a tool comprising micro-NMR devices that is conveyed by coil tubing, wireline, slickline, drill pipe conveyance, and/or a while-drilling conveyance interface. Additionally, as will be described in more detail below with reference to FIG. 8, systems and methods disclosed herein can be used with micro-NMR devices disposed on other completion components or surface equipment, such as on pumps, tubing, casing, or joints between any of these components. For the purpose of an example only, FIG. 1 depicts a while-drilling interface. However, systems and methods disclosed herein could apply equally to wireline or any other suitable conveyance means. The bottom hole assembly 100 of the illustrated embodiment includes a logging-while-drilling (LWD) module 120, a measuring-while-drilling (MWD) module 130, a roto-steerable system and motor, and drill bit 105.

The LWD module 120 is housed in a special type of drill collar, as is known in the art, and can contain one or a plurality of known types of logging tools. It will also be understood that more than one LWD and/or MWD module can be employed, e.g. as represented at 120A. (References, throughout, to a module at the position of 120 can alternatively mean a module at the position of 120A as well.) The LWD module includes capabilities for measuring, processing, and storing information, as well as for communicating with the surface equipment. In the present embodiment, the LWD module includes a nuclear magnetic resonance measuring device.

The MWD module 130 is also housed in a special type of drill collar, as is known in the art, and can contain one or more devices for measuring characteristics of the drill string and drill bit. The MWD tool further includes an apparatus (not shown) for generating electrical power to the downhole system. This may typically include a mud turbine generator powered by the flow of the drilling fluid, it being understood that other power and/or battery systems may be employed. In the present embodiment, the MWD module includes one or more of the following types of measuring devices: a weight-on-bit measuring device, a torque measuring device, a vibration measuring device, a shock measuring device, a stick slip measuring device, a direction measuring device, and an inclination measuring device.

Figure 2A:
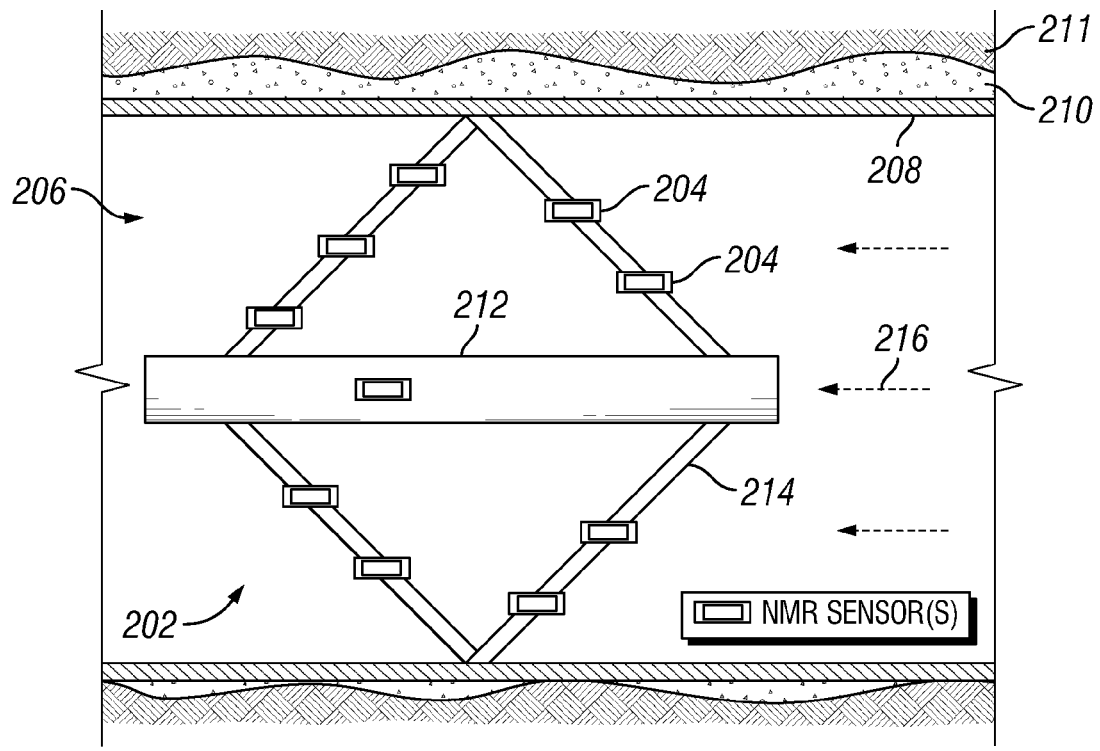
FIGS. 2A, 2B, and 2C illustrate a production logging tool comprising a plurality of micro-NMR sensors, according to exemplary embodiments.
Figure 2B:
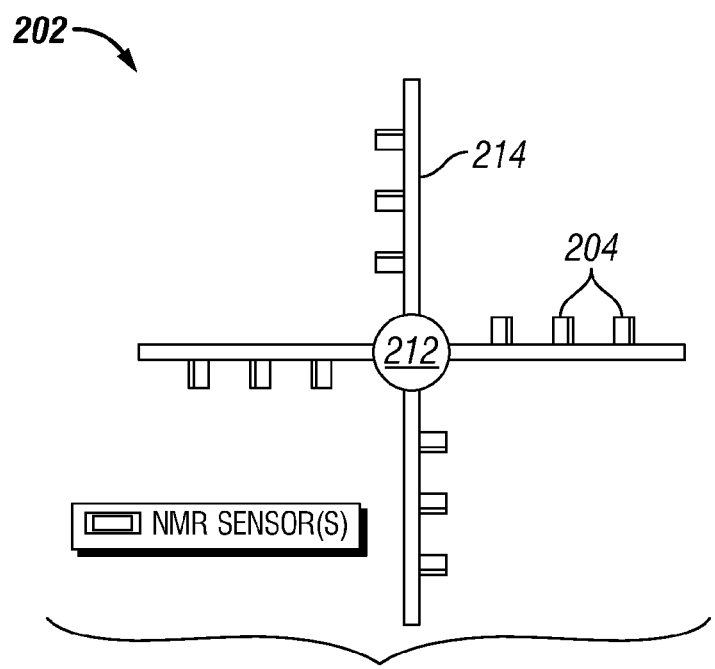

FIG. 2A illustrates a side view of a production logging tool 202 comprising a plurality of micro-NMR sensors, according to an exemplary embodiment. FIG. 2B illustrates a top view of a production logging tool 202 comprising a plurality of micro-NMR sensors 204, according to an exemplary embodiment. In an exemplary embodiment, the micro-NMR sensors 204 of the tool 202 can be included as an attachment to a variety of conventional production logging tools, such as resistivity, nuclear, electromagnetic, or other tools known to those of ordinary skill in the art. Alternatively, in certain embodiments, the micro-NMR sensors 204 can be located on a tool 202 dedicated solely to NMR measurements. Regardless, as shown in FIG. 2A, the tool 202 can be placed downhole, in the wellbore 206, within the casing 208 and/or cement 210. In various alternative embodiments, the tool 202 can be used with cased boreholes, uncased boreholes, and/or completed boreholes.

The tool 202 can be lowered into the wellbore 206 via any suitable conveyance method, as discussed with the tools mentioned above with reference to FIG. 1. The tool 202 can include a plurality of micro-NMR sensors 204, surface mounted and/or disposed on the body 212 and one or more arms 214 of the tool 202. In an exemplary embodiment, the arms 214 can have the ability to open and close to provide a spatial distribution of sensors 204 leading to a radial map of the fluids. In such a case, a sensor (not shown) can measure the extent of the arms 214 opening, from which the distribution of sensors in the cross section of the well can be deciphered.

As indicated by the flow 216 arrows, while the tool 202 is disposed in the wellbore 206, fluid in the well may flow up the wellbore 206 and to the tool 202, where the fluid may interact with the micro-NMR sensors 204 on the tool 202. This way, the micro-NMR sensors 204 can measure the NMR responses of the fluids in the borehole. In various embodiments, the fluids of interest can include drilling mud, formation fluid (e.g., water, oil, gas), injected fluid, or a combination thereof. Additionally, the tool 202 can have the ability to measure fluid properties continuously and/or in batch mode where it isolates a volume of fluid in a sample chamber (not shown) prior to making measurements. Certain of these methods of collecting and measuring the fluid will be discussed in more detail below with reference to FIG. 11.

Though the tool 202 shown in FIG. 2A includes four expandable arms 214 on which the micro-NMR sensors 204 are mounted, in various exemplary embodiments, the tool 202 can include fewer or greater than four expandable arms 214, allowing even more sensors 204 to be distributed within the cross sectional area of the borehole.

The plurality of micro-NMR sensors 204 and their spatial distribution may be used to map the fluid distribution across the well bore. In other words, data collected by each of the micro-NMR sensors 204 distributed throughout the cross-sectional area of the borehole (as well as sensors 204 axially separated from each other) can be analyzed to provide an indication of differences in the characteristics of the fluid coming into contact with each of the sensors 204. In various exemplary embodiments, the sensor 204 attached to the body 212 of the tool 202 can be used for a single point or average measurement or it may be used in conjunction with the sensors 204 on the arms 214 to establish a fluid map. Such a fluid map can be useful to determine the flow regime of the multiphase flow under the downhole condition. As may be recognized by one of ordinary skill in the art, a flow regime can refer to patterns of the flow 216 paths of the various phases of liquid flowing through the wellbore 206 (e.g., speeds and positions in the wellbore 206 of the water, gas, and/or oil).

Figure 2C:
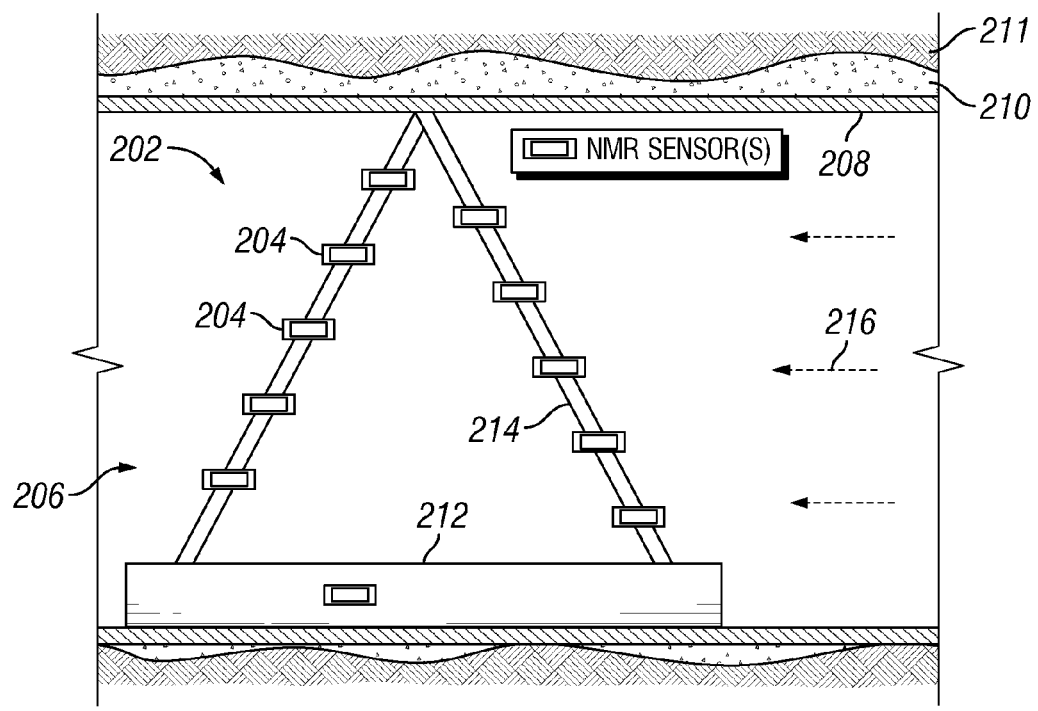

FIG. 2C illustrates a production logging tool 202 comprising a plurality of micro-NMR sensors 204, according to an alternative exemplary embodiment. The tool 202 shown in FIG. 2A can be similar to the tool 202 shown in FIG. 2C, but in an eccentered orientation. In other words, as shown in FIG. 2C, the body 212 of the tool 202 may be on one side of the tool 202 (such as against the casing 208 or borehole wall) with the arms 214 on the other side, as opposed to the substantially symmetric configuration with four arms 214 shown in FIG. 2A. An eccentered tool 202 may have certain benefits in certain configurations. For example, in certain wellbores 206, the production tube may be eccentered within the casing 208. Moreover, an eccentered tool 202 may be less intrusive to the fluid flow 216 in the wellbore 206. In one embodiment, the arms 214 of the tools shown in FIGS. 2A-2C can be motorized to provide an even greater region over which the sensors 204 interact with the fluid.

In the embodiments illustrated in FIGS. 2A-2C, the sample point (i.e., the location from which the fluid is taken that interacts with the micro-NMR sensor 204) is the same as the location of the micro-NMR sensor 204. In alternative embodiments, these locations can be different. For example, FIGS. 3A, 3B, and 3C illustrate production tools 202 comprising a plurality of micro-NMR sensors 204 that sample fluid taken from another region 318, 320 of the wellbore 206, according to exemplary embodiments.

Figure 3A:
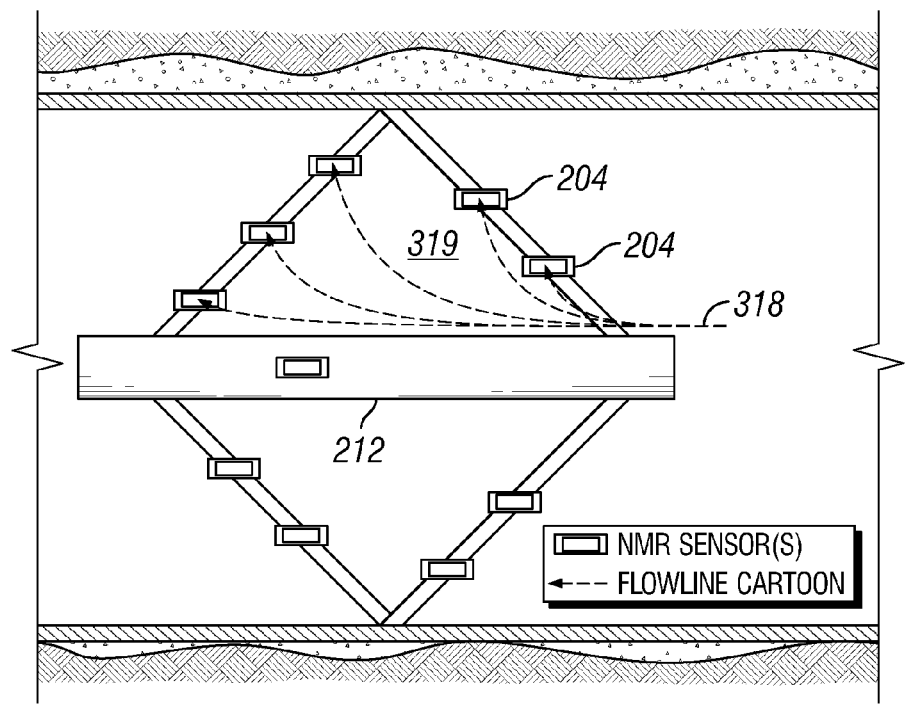
FIGS. 3A, 3B, and 3C illustrate production logging tools comprising a plurality of micro-NMR sensors that sample fluid taken from another point or region of the wellbore, according to exemplary embodiments.
Figure 3B:
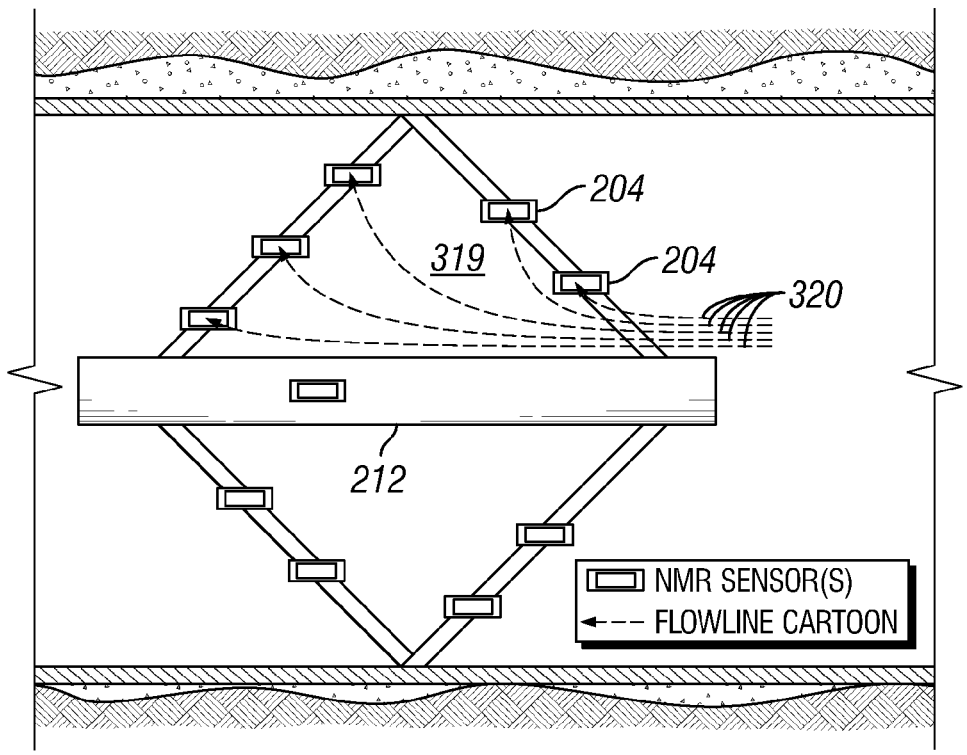
Figure 3C:
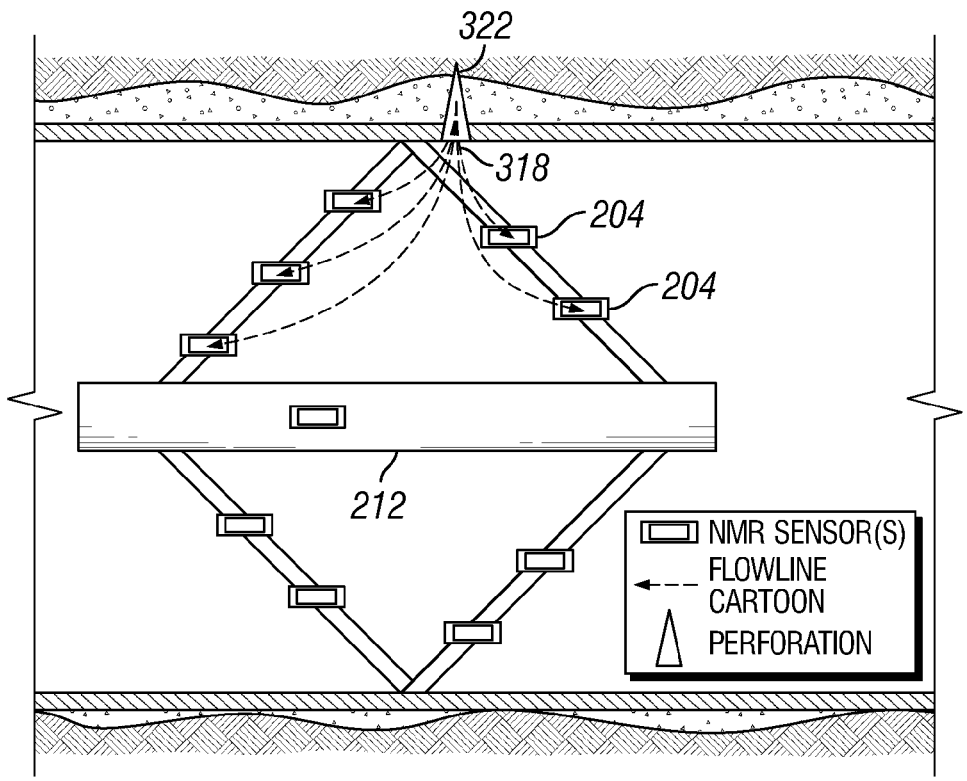

FIG. 3A shows a production tool 202 similar to that production tool 202 illustrated in FIG. 2A. However, unlike the production tool 202 illustrated in FIG. 1, the production tool 202 of FIG. 3 has one mutual sample point 318 from which the fluid is taken that interacts with several of the micro-NMR sensors 204. In certain embodiments, this mutual sample point 318 can be selected or elected to optimize the signal to noise ratio based on the anticipated flow profile in the production string. In another embodiment of the invention, the position of sample point 318 can be varied. In this case once enough data is collected in a particular position in the cross sectional area of the well, the sample point 318 is moved and the data acquisition is repeated. This enables fluid composition in the cross section of the well to be measured with desired degree of accuracy. In another embodiment of the invention a reduced number of sensors 204 are used, and instead each micro-NMR sensor 204 can used repeatedly to obtain the desired signal-to-noise ratio.

The mutual sample point 318 feature can be useful when it is desirable to have multiple micro-NMR sensors 204 analyzing fluid from a location, but where space constraints may limit how many sensors 204 can be placed in that location. Such an arrangement can dramatically increase the amount of NMR data collected from fluid from a given location, which can significantly increase the signal-to-noise ratio for the data collected from the fluid.

Various methods exist for creating flow lines from a mutual sample point 318 to the plurality of micro-NMR sensors 204. For example, in one embodiment, a plurality of tubes with one end connected to each of the micro-NMR sensors 204 and the other ends fused or otherwise connected together at the mutual sample point 318 can be used.

The exemplary production tool 202 shown in FIG. 3B is similar to the tool 202 of FIG. 3A, but includes a mutual sample region 320 instead of a mutual sample point 318 connected to the plurality of micro-NMR sensors 204. As with the mutual sample point 318, the mutual sample region 320 can be selected to optimize the signal to noise ratio based on the anticipated flow profile in the production string, and can be useful when it is desirable to have multiple micro-NMR sensors 204 analyzing fluid from a given region, though not necessarily the same point. Mutual sampling from a given region rather than from a particular point may be useful when fluid from a given region is desired to be analyzed, but some radial or axial diversity is desired in the sample region 320. Flow lines from the mutual sample region 320 can be created by a variety of methods, such as those similar to the methods for creating flow lines from mutual sample points 318, as described above.

The exemplary production tool 202 shown in FIG. 3C is also similar to the tool 202 of FIG. 3A, but includes a mutual sample point 318 proximate to a perforation point 322. As discussed above with reference to FIG. 3A, the mutual sample point 318 can be selected to optimize the signal to noise ratio based on the anticipated flow profile in the production string. Additionally, it may be beneficial to have a mutual sample point 318 proximate to a perforation point 322 to be able to sample and analyze the fluid soon after it exits the formation 211 and passes through the perforation point 322, and therefore less likely to be contaminated with other fluids in the wellbore 206 which may originate from other formation layers, for example.

Figure 4A:
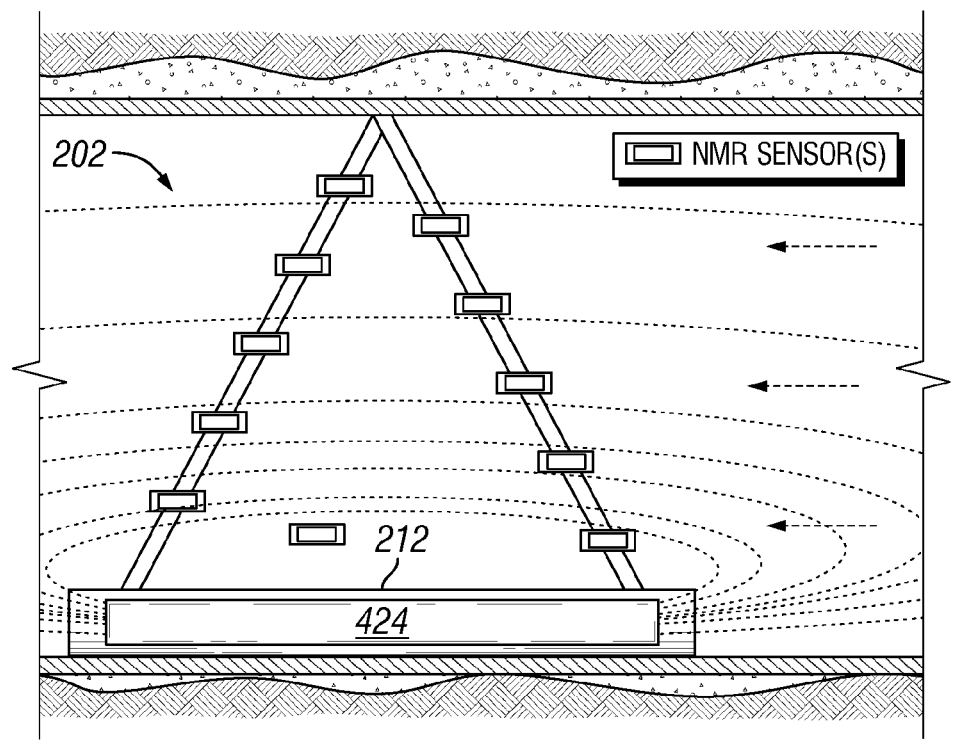
FIGS. 4A and 4B illustrate production tools comprising a plurality of micro-NMR sensors that include a magnet, according to exemplary embodiments.
Figure 4B:
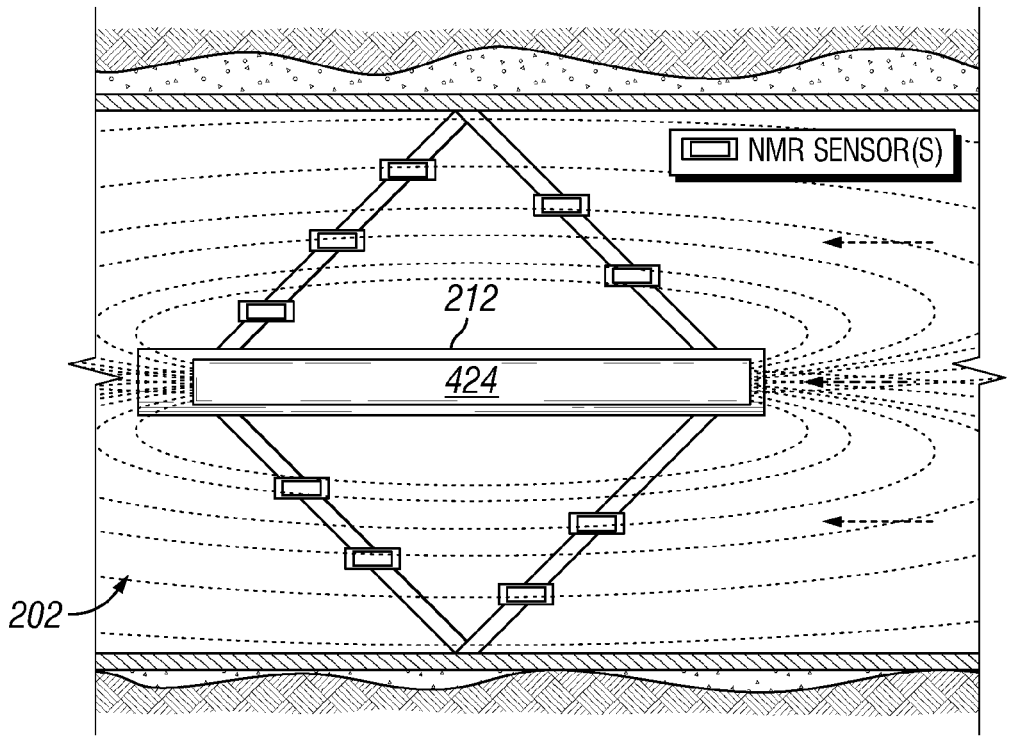

FIGS. 4A and 4B illustrate production tools 202 comprising a plurality of micro-NMR sensors 204 that include a magnet 424, according to exemplary embodiments. As described above, tools capable of making NMR measurements generally include a device for generating magnetic fields $B_0$ and $B_1$. As may be recognized by one of ordinary skill in the art having benefit of the present disclosure, the static $B_0$ magnetic fields are often created by a permanent magnet, and the oscillating $B_1$ magnetic fields are often created by a series of RF pulses.

Accordingly, when only one micro-NMR sensor 204 is utilized, in many embodiments it may need its own dedicated $B_0$ source, which may comprise one or more pieces of a permanent magnet 424 material such as samarium cobalt (SmCo), for example. The length of the magnet 424 and the flow velocity can together control the mode of operation.

Specifically, for high velocity flows and/or magnets 424 with short pre-polarization length, a batch mode operation may be more effective, or in some cases, required. In a batch mode, a sample can be passed to the sensitive area of the device, trapped, allowed a polarization time of a few seconds by the magnet 424, measured, and then disposed or returned to the flow. Conversely, in other situations, when the flow is slow enough that a continuous sample passing through the sensitive region can be polarized and measured, a continuous mode of operation may be possible. Due to the fluid mechanics and the effect of contacting the fluid with the magnetic field, as the fluid flow velocity increases, a longer magnet 424 can be used to compensate for the flow. Moreover, with appropriate choice of a pre-polarization magnet 424, a continuous measurement may be possible.

For multiple sensors 204 it may be possible to use one large magnet 424 to pre-polarize fluid for each sensor 204, as shown in FIGS. 4A and 4B. As shown in FIG. 4A, the eccentered production tool 202 of FIG. 2C can include one large magnet 424 on the body 212 of the tool 202. The magnet 424 can be sufficiently strong and long enough (in the z direction) to provide pre-polarization for all or some of the sensors 204 at substantially the same time. As may be recognized by one of ordinary skill in the art having benefit of the present disclosure, "pre-polarization" can refer to the polarization effectuated by the permanent magnet 424 passing by the regions of interest prior to the NMR antenna. In some cases this magnet 424 can serve as the source of $B_0$ for specific individual sensors 204 as well. In such an embodiment, the operating frequency of different sensors 204 depends on their radial distance to the magnet 424 and thus is not constant throughout the different micro-NMR sensors 204. If, in certain embodiments, the same frequency is desired, the sensors 204 can have their own dedicated magnet 424 for performing NMR measurements, and the large magnet 424 will be used for pre-polarization only. In an alternative embodiment, a long permanent magnet 424 may be part of the casing 208 itself. FIG. 4B is similar to FIG. 4A, but shows a centered tool 202 (such as the tool 202 shown in FIG. 2A), rather than an eccentered tool 202. To generate an NMR signal, the direction of B0 and B1 may need to be perpendicular to each other. The B0 field direction in FIGS. 4A and 4B are substantially axial (along the z axis), and thus the micro-coil used inside the micro-NMR sensors 204 may need to be in the radial direction (x or y direction or any combination thereof) to ensure a maximum NMR signal. Using a single permanent magnet, such as shown in FIGS. 4A and 4B is particularly useful when the micro-NMR sensors 204 are at a location different from the sampling point (as in FIGS. 3A-3C). In this case, the sensors 204 can be physically arranged to have the same B0 and thus the same frequency of operation. Alternatively the micro-NMR sensors 204 can be arranged to have a different B0 (and thus different frequency of operations) as desired. In this way a plot of $T_2$ versus B0, for example, can be constructed.

Regardless of the arrangement of the micro-NMR sensors 204, as shown throughout FIGS. 2-4, after the NMR measurements are performed on the fluid sample, the measurements can then be used to identify the fluid. In exemplary embodiments, various conventional NMR measurements can be performed on the fluid sample. As discussed above and/or as may be recognized by one of ordinary skill in the art having benefit of the present disclosure, such measurements can include a CPMG sequence of pulses leading to spin echoes whose time dependence is used to determine $T_1$ and $T_2$ relaxation times.

Figure 5A:
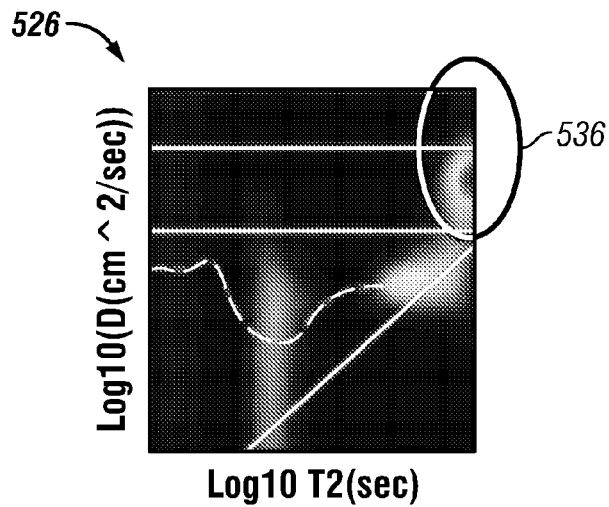
FIG. 5 illustrates three $D$-$T_2$ maps reflecting data collected by a production logging tool, according to an exemplary embodiment.
Figure 5B:
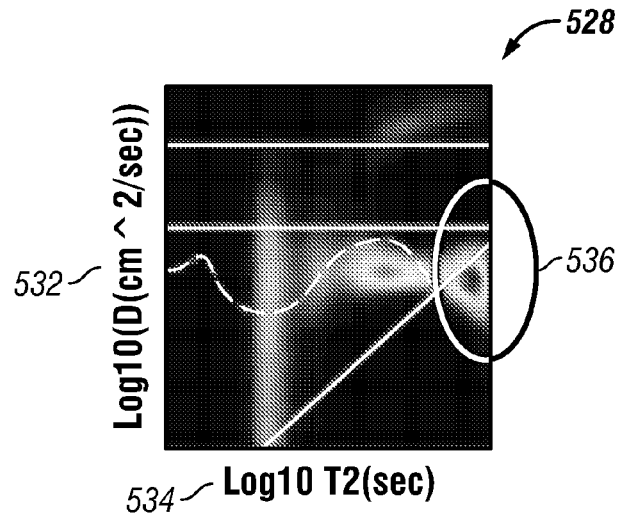
Figure 5C:
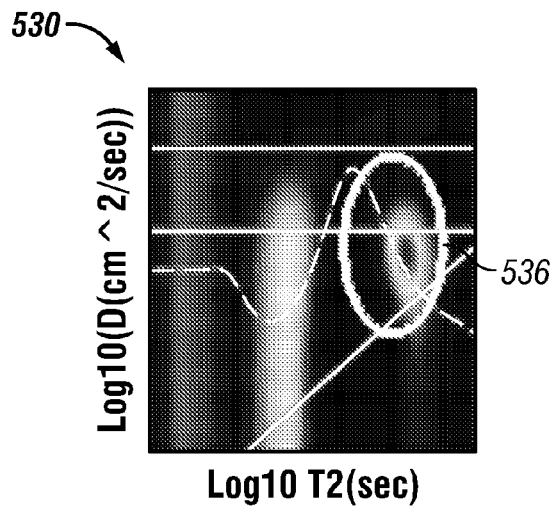

Alternatively (or additionally), NMR measurements can involve the use of sequences with variable wait time and $T_E$ to determine the diffusion constant, D, of the sample. For example, a D-$T_2$ map, known to those of ordinary skill in the art, can be used to identify the fluid. FIG. 5 illustrates three D-$T_2$ maps 526, 528, 530, according to an exemplary embodiment. The D-$T_2$ maps 526, 528, 530, which plot a diffusion constant versus $T_2$, indicate the presence of gas, light reservoir oil, and OBM mud filtrate, based on the relative diffusivities 532 and $T_2$ times 534. As can be seen in the plots, the position of the coloration 536 in the plots can be used to identify the presence of gas, light reservoir oil, and OBM mud filtrate. Though FIG. 5 includes only D-$T_2$ maps which are two dimensional, in various embodiments the graphical analysis and depictions can extend to Diffusion, $T_1$, $T_2$, Time, viscosity, and/or any combination thereof which can be two or more dimensional.

An attractive feature of the micro-NMR devices can be their small sensitive region. As the sensitive region becomes smaller, the magnetic field inhomogeneity caused by variation is magnetic material properties become less important to the point that it becomes feasible to perform NMR spectroscopy. This had not been feasible with conventional NMR logging tools to date. In the micro-NMR setting, however, it can be possible to use a single 90 degree pulse and measure the free induction decay (FID). The FID can be Fourier Transformed to obtain the entire spectrum, which not only allows identification of different phases, but also allows assignment of the spectrum to different components, or groups of components for further elucidation of the fluid properties. In addition to the wealth of composition information provided by this measurement approach, since the measurement is only a single 90 degree pulse, faster sampling can be achieved too. Moreover, in certain embodiments, performing NMR spectroscopy can also enable the performance of NMR on spins other then protons, such as $^{13}C$ for example.

Figure 6:
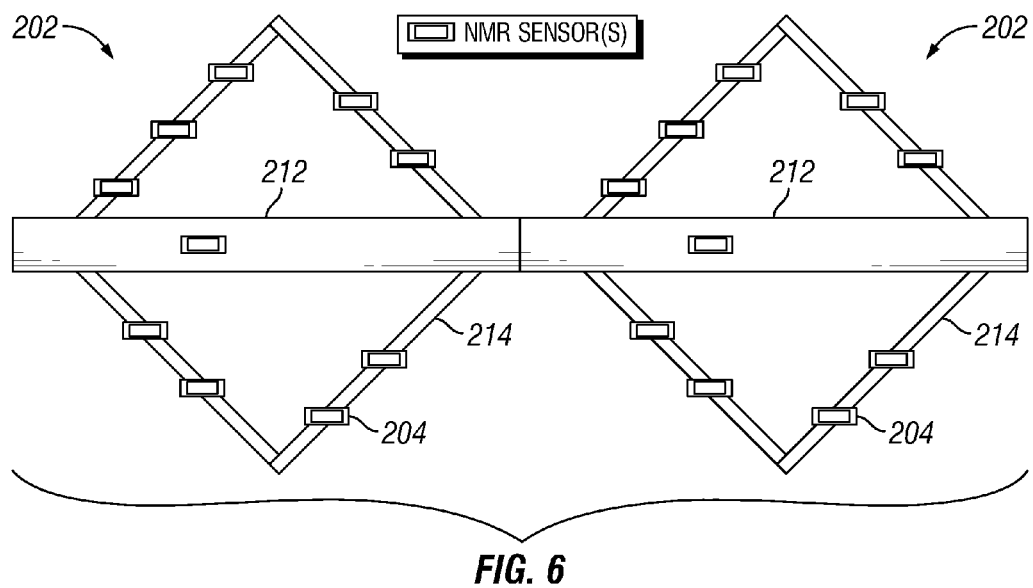
FIG. 6 illustrates two axially separated production logging tools comprising a plurality of micro-NMR sensors, according to an exemplary embodiment.

In addition to radial mapping, in certain embodiments it is possible to generate multiple maps separated axially. FIG. 6 illustrates two axially separated production logging tools 202 comprising a plurality of micro-NMR sensors 204, according to an exemplary embodiment. If so desired, the distance between the two production logging tools can be increased further by adding an extra section or another logging tool between them. In other embodiments, three or more production logging tools can be included and axially separated from each other. The two axially separated production logging tools 202 shown in FIG. 6 can be used together to generate two radial maps of the fluid properties. In an exemplary embodiment, these results can be combined to form simultaneous radial and axial maps. Additionally, the signals in the two radial maps can be correlated and can be used to determine flow velocity of different phases as well as the flow regimes.

Figure 7A:
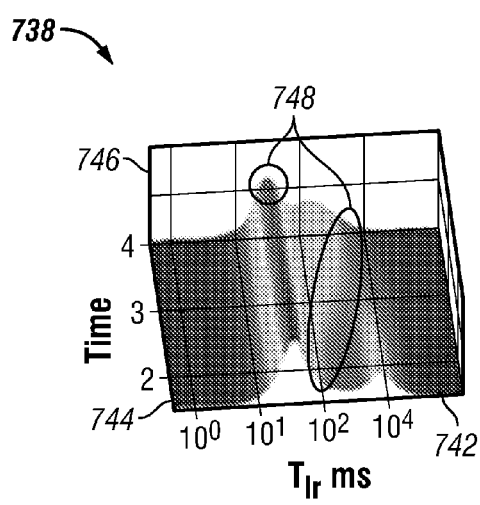
FIGS. 7A and 7B illustrate two sets of data collected as a function of time by a production logging tool, according to exemplary embodiments.
Figure 7B:
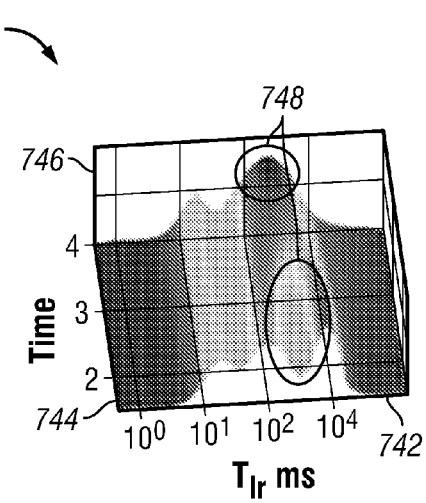

Regardless of whether one production logging tool 202 is used or if multiple production logging tools 202 are used, data collected from these tools 202 over time can be used to produce data or images corresponding to time lapse fluid variation. FIGS. 7A and 7B illustrate two sets of data collected as a function of time, according to exemplary embodiments. Each of the two plots 738, 740 can show how the fluid properties contacting the micro-NMR sensors 204 can change as time lapses. Each of the two plots 738, 740 show $T_{1r}$ on the x-axis 742, Time on the y-axis 744, and intensity of the $T_1$ signal on the z-axis 746. Accordingly, it can be seen from the two plots 738, 740 that the $T_{1r}$ peaks 748 change over time, indicating a change in the fluid makeup being analyzed over time. The time scale of these measurements may depend on the life and history of the well and may be relatively slowly varying when the well is producing a steady flow of fluids. Moreover, the time scale can suddenly change when an external intervention such as water injection reaches the measurement point. Accordingly, data collected over time periods can enable fluid profiling for both produced, injected, and segregation.

Figure 8:
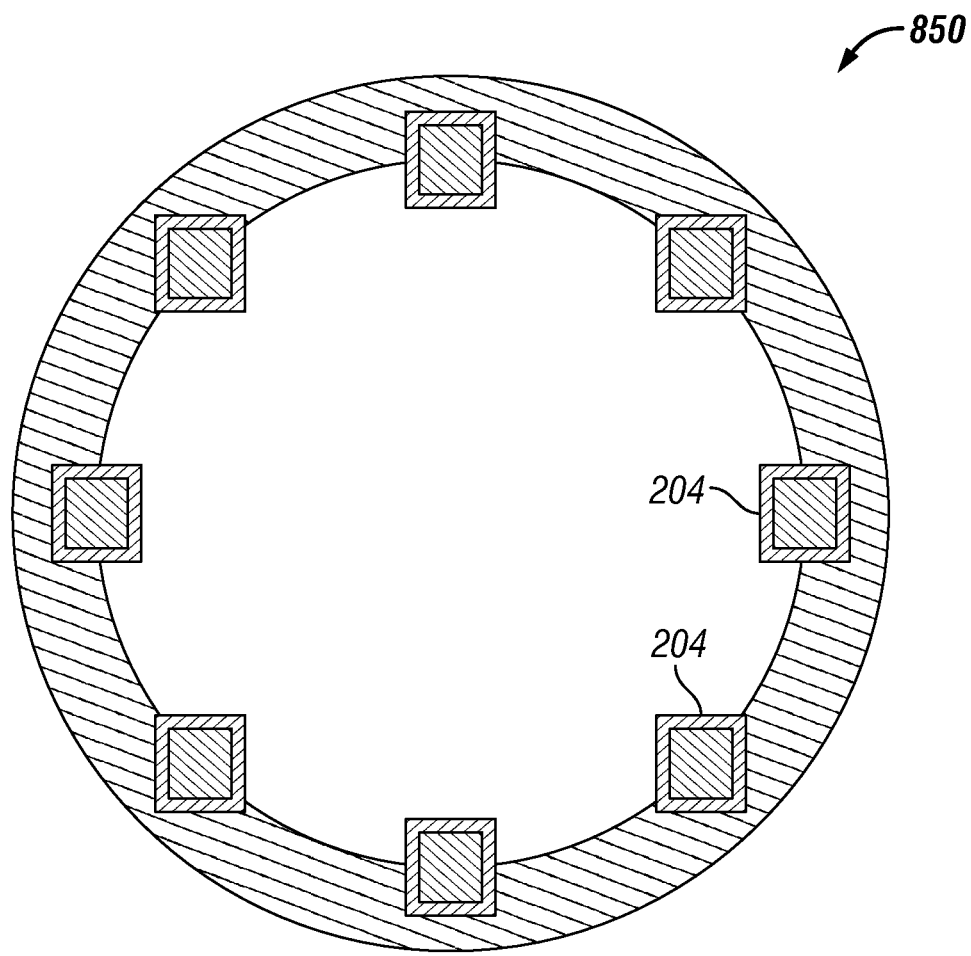
FIG. 8 illustrates a cross-section of an inline joint with micro-NMR sensors embedded thereon, according to an exemplary embodiment.

The foregoing exemplary embodiments have largely focused on production logging tools as vehicles for carrying micro-NMR sensors 204 downhole. In alternative embodiments, other completion components, surface equipment, and the like can provide a surface for embedding the micro-NMR sensors 204 such that they interact with the fluids of interest. For example, inline production equipment such as completion components, pumps, tubing, and/or casing 208 all can be used to house or provide a surface for micro-NMR sensors 204. FIG. 8 illustrates a cross-section of an inline joint 850 with micro-NMR sensors 204 embedded thereon, according to an exemplary embodiment. As shown, the micro-NMR sensors 204 can be radially spaced around the inline joint, and as such, can contact fluids of interest as they pass through the joint. In this arrangement, different micro-NMR sensors 204 may be disposed a desired distance from the wall (not shown) to provide a fluid map.

Figure 9:
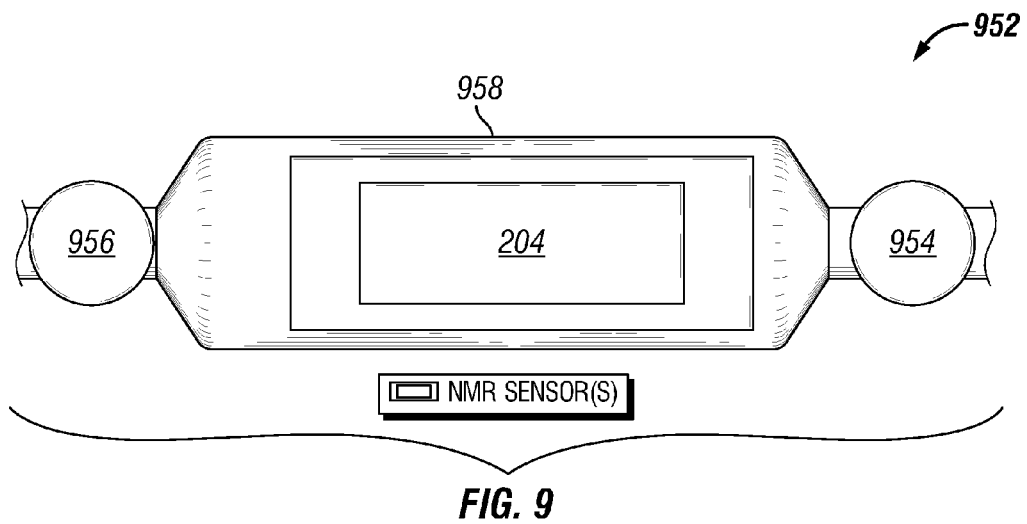
FIG. 9 illustrates a micro-NMR device with a fluid isolation system attached thereto, according to an exemplary embodiment.

As discussed above, in certain situations, the fluids of interest may have a flow rate that is too fast to allow sufficient magnetization to build up to perform proper NMR measurements. In such cases, the fluids can be isolated from the flow and then measured. FIG. 9 illustrates a micro-NMR device with a fluid isolation system 952 attached thereto, according to an exemplary embodiment. As shown in FIG. 9, the fluid isolation system 952 can include multi-port valves, for example, positioned on the input and output ports of the micro-NMR devices. Accordingly, using the fluid isolation system 952 shown in FIG. 9 can include having the inlet isolation device 954 open to allow fluid to flow to the micro-NMR sensor 204 within a chamber 958, but keeping the outlet isolation device 956 closed to prevent the fluid from escaping before the sensor 204 has completed the measurement. If necessary, the inlet isolation device 954 can then be closed to prevent additional fluid from entering the system and contacting the sensor 204. Alternatively both isolation devices 954, 956 can be open for a period of time until the desired sampling time is reached at which point both these isolation devices 954, 956 are closed to trap the sample for NMR measurement. After the sensor 204 has completed the NMR measurement, the outlet isolation device 956 can be opened to release the measured fluid back into the fluid flow. Having inlet isolation device 954 also open helps to flush the sample chamber. Various other methods for using fluid isolation systems can be used, as may be recognized by one of ordinary skill in the art having benefit of the present disclosure.

Figure 10:
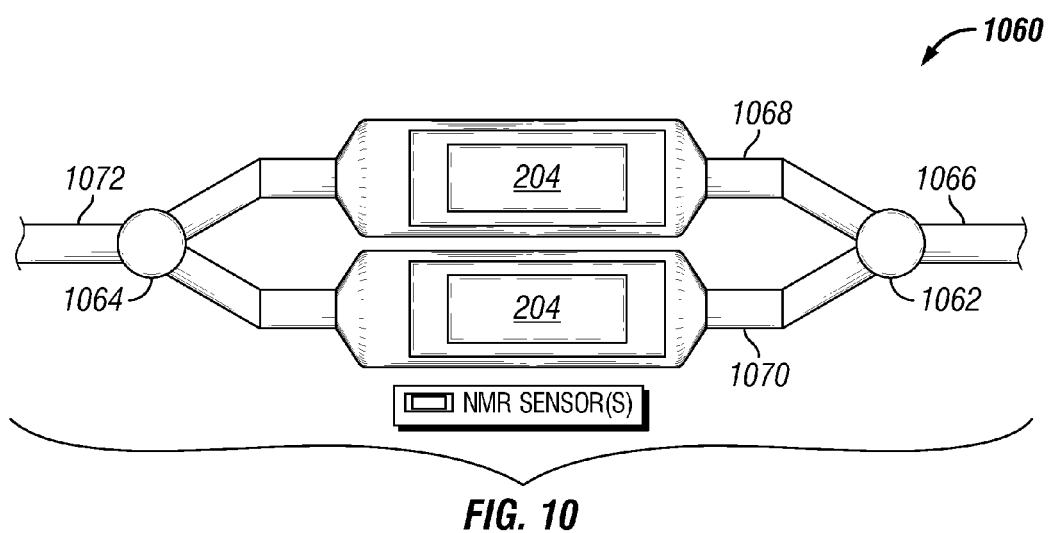
FIG. 10 illustrates micro-NMR devices attached to a fluid isolation system for taking and accumulating multiple samples from one location, according to an exemplary embodiment.

In addition to performing NMR measurements on an isolated sample with the micro-NMR sensors 204 as shown in FIG. 9, the micro-NMR sensors 204 equipped with certain exemplary fluid isolation devices also can be combined to take samples from the same location and measure them subsequently and/or alternately. FIG. 10 illustrates micro-NMR devices attached to a fluid isolation system 958 for taking and accumulating multiple samples from one location, according to an exemplary embodiment. As shown in FIG. 10, the exemplary fluid isolation system 958 can include two sensors 204 that are connected to the same inlet and outlet isolation devices 1062, 1064. The inlet and outlet isolation devices 1062, 1064 can help define certain sections of the isolation system 958: a first section 1066 upstream of the inlet isolation device 1062, a second section 1068 comprising the upper branch downstream of the inlet isolation device 1062, a third section 1070 comprising the lower branch downstream of the inlet isolation device 1062, and a fourth section 1072 downstream of the outlet isolation device 1064. In an exemplary embodiment, the inlet and outlet isolation devices 1062, 1064 can have open and closed states as to each of the first and fourth sections 1066, 1072. In other words, at any given time, the inlet and outlet isolation devices 1062, 1064 can be used to allow fluid to flow into or out of the second section 1068, allow fluid to flow into or out of the third section 1070, prevent fluid from flowing into or out of the second section 1068, prevent fluid from flowing into or out of the third section 1070, and/or any combination thereof. Moreover, in certain embodiments, the exemplary isolation system 958 arrangement can allow one sensor 204 to make a measurement while the second is sampling, polarizing, and/or analyzing, or flushing the sample.

Though the fluid isolation system 958 shown in FIG. 10 includes two micro-NMR devices, the same concept can be applied to any number of multiple micro-NMR devices. In exemplary embodiments, any number of devices can be attached together with this technique to increase the sampling rate and to increase the time resolution of measurement. These isolation devices can enable multiple sensors 204 to be combined independently or channeled to the same measuring point. As discussed above with reference to FIG. 3, the fluid isolated systems can be positioned in locations different from the sampling positions. For example, a fluid isolation system can include multiple NMR sensors 204 that sample fluid all from one desired location or region. Combining fluid isolation chambers can enable increased cleanout efficiency, increased sampling, data collection, and signal to noise ratio.

Figure 11:
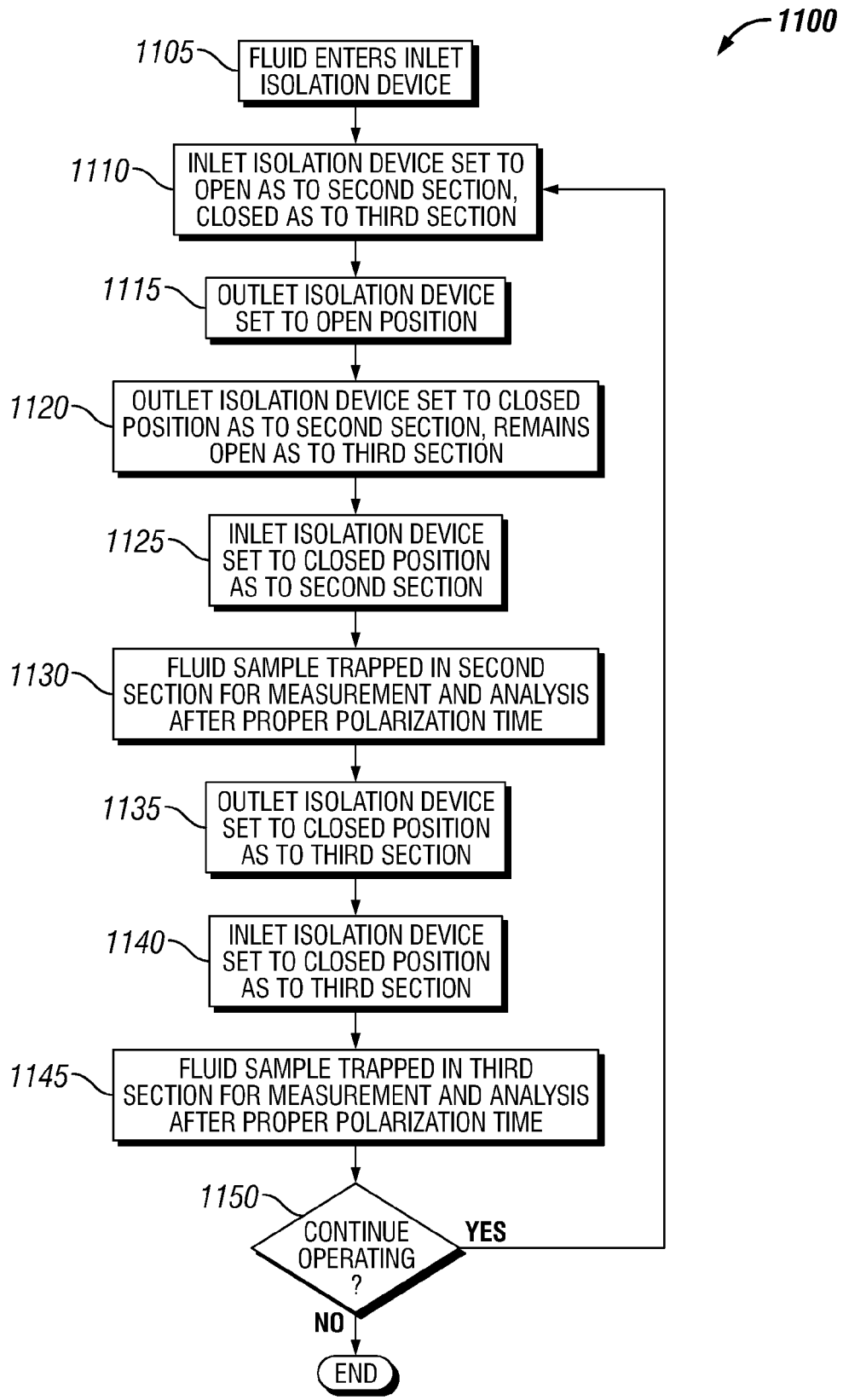
FIG. 11 is a flow chart illustrating a method for using a fluid isolation system, according to an exemplary embodiment.

The use of an exemplary fluid isolation system 1060, such as the system 1060 shown in FIG. 10, will now be described with reference to FIG. 11, which is a flow chart illustrating a method for using a fluid isolation system 1060, according to an exemplary embodiment. In step 1105, fluid enters the isolation system 1060 through the first section 1066 of the device. In step 1110, the inlet isolation device 1062 is set to an open position as to the second section 1068 of the isolation system 1060, but a closed position as to the third section 1070. In an exemplary embodiment, this can be accomplished by adjusting the inlet isolation device 1062 to direct fluid to the second section 1068.

In step 1115, the outlet isolation device 1064 is set to an "on" or "open" position. In an exemplary embodiment, by opening the outlet isolation device 1064, the fluid passing through the isolation system 1060 can flush out any contents previously trapped in the second section 1068 of the isolation device.

In step 1120, the outlet isolation device 1064 is set to a "closed" position as to the second section 1068, but to an "open" position as to the third section 1070. In other words, the outlet isolation device 1064 can be set to prevent any fluid in the section from exiting the isolation system 1060, but can allow fluid passing through the third section 1070 to exit the isolation system 1060.

In step 1125, the inlet isolation device 1062 is set to a closed position as to the second section 1068, but an open position as to the third section 1070. In other words, the inlet isolation device 1062 at this point can prevent fluid from entering the second section 1068, but allow fluid to enter the third section 1070. Accordingly, at this point in time, fluid that previously entered the second section 1068 can be trapped therein (with no additional fluid entering the second section 1068), where it can be analyzed. Conversely, fluid flowing into the third section 1070 can flow through and exit through the outlet isolation device 1064 and fourth section 1072 of the isolation system 1060, thereby flushing out the third section 1070.

In step 1130, the fluid sample trapped in the second section 1068 can be measured and analyzed after a proper polarization time. In various exemplary embodiments, the proper polarization time can be set or determined based on conventional factors, such as the characteristics of the environment, the type of fluid likely present in the sample, and the like. Such factors may be recognized by one of ordinary skill in the art having benefit of the present disclosure. The micro-NMR sensor 204 in the second section 1068 of the isolation system 1060 can be used to measure and/or analyze the fluid sample trapped therein.

In step 1135, the outlet isolation device 1064 is set to a closed position as to the third section 1070 (in addition to the second section 1068 remaining in a closed position). Accordingly, at this point, fluid entering the isolation system 1060 is not exiting either the second or third section 1070. During this period of time, a fluid sample may start to accumulate in the third section 1070. In an exemplary embodiment, the time at which the outlet isolation device 1064 is set to the closed position as to the third section 1070 can be defined by—or at least partially affected by—the signal to noise ratio. Essentially, in certain embodiments, a fluid sample can be collected until the signal to noise ratio would reach an acceptable level, since larger samples generally correlate to having a larger signal to noise ratio.

In step 1140, the inlet isolation device 1062 is set to a closed position as to the third section 1070 (in addition to the second section 1068 remaining in a closed position). Accordingly, at this point, fluid may not be entering or exiting either the second or third section 1068, 1070, and fluid samples may be present in each of the second and third sections 1068, 1070 of the isolation system 1060. In an alternative embodiment, fluid may begin exiting the second section 1068 during this step. In an exemplary embodiment, the time at which the inlet isolation device 1062 is set to the closed position as to the third section 1070 can be defined by—or at least partially affected by—the signal to noise ratio.

In step 1145, the fluid sample trapped in the third section 1070 is analyzed, as described above in step 1130 with reference to the fluid sample trapped in the second section 1068. In step 1150, the method 1100 then determines whether to continue operating the fluid isolation system 1060. If the fluid isolation system 1060 is to continue operating, the method 1100 returns to step 1110, where the inlet isolation device 1062 is set to an open position as to the second section 1068. As the entire method 1100 is repeated, the settings of the inlet and outlet isolation devices 1062, 1064 can be set as described in steps 1105-1145 (or in other ways) so that one of the second and third sections 1068, 1070 is sealed and measured while simultaneously flushing or cleaning out the other section. However, if the fluid isolation system 1060 is not to continue operating, then the method 1100 ends.

Figure 12:
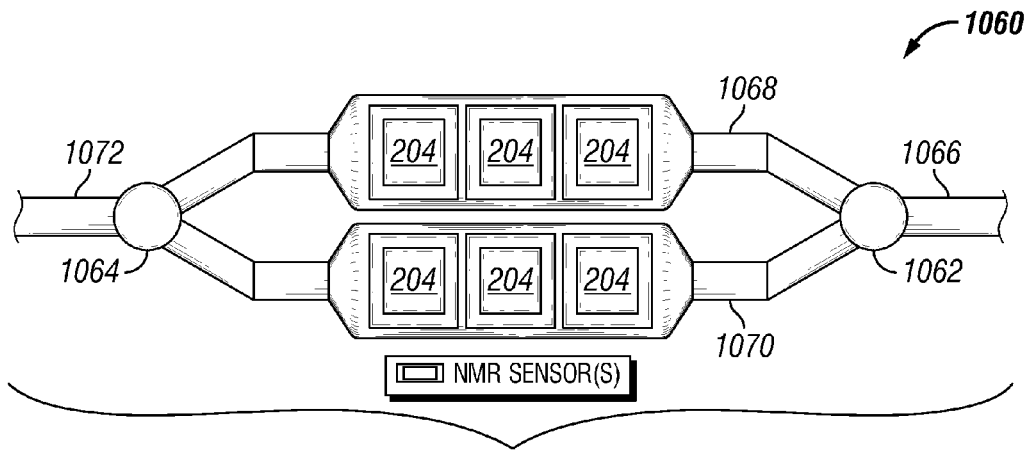
FIG. 12 illustrates a fluid isolation system attached to micro-NMR devices split into multiple paths containing multiple sensors, according to an exemplary embodiment.

FIG. 12 illustrates a fluid isolation system attached to micro-NMR devices split into multiple paths containing multiple sensors 204, according to an exemplary embodiment. As with the fluid isolation systems discussed above with reference to FIGS. 10-11, the fluid isolations system of FIG. 12 can include an inlet and outlet isolation devices, and separate paths for the fluid. As shown in FIG. 12, the fluid isolation device can include three micro-NMR sensors 204 in each of the fluid paths. In other embodiments, any number of micro-NMR sensors 204 can be placed in each of the paths.

Combining two or more micro-NMR sensors 204 in a deviated measuring chamber as shown in FIG. 12 can enable segregated fluid properties to be measured, since additional information can be collected and analyzed if the isolated micro-NMR sensor 204 paths are divided into multiple sensors 204. In exemplary embodiments, once the fluid is isolated in either of the two paths, during polarization time there can be segregation of phases and having the three (or more) sensors 204 within the path allows these segregated portions to be studied in more detail. The time between isolating the fluid and measuring can be varied if more time is desired for segregation. Fluid isolated in a path may often be multiphase, and accordingly, may segregate into its gas, oil, and water constituents across the three sensors 204 because of the limited miscibility and varying densities among the three types of fluid. In addition to characterizing segregated phases, a series of measurements as a function of time may provide valuable information on the rate of segregation. This information may be significant because it can enable the monitoring of the relative amount of water produced in the wellbore 206, and how that amount changes over time, as increasing water can indicate declining rates of production of oil and gas form the well. Moreover, in certain embodiments, multiple sensors 204 can share the same magnet 424.

Figure 13A:
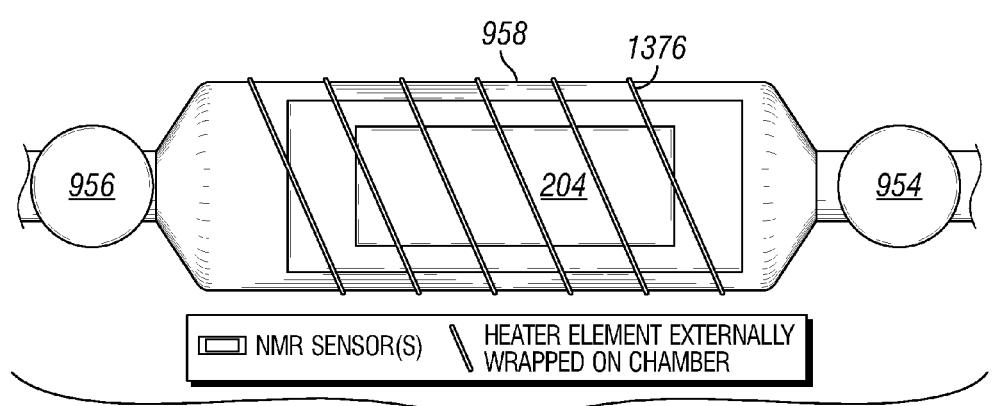
FIGS. 13A and 13B illustrate multiple embodiments of a micro-NMR apparatus for performing in situ measurements, according to exemplary embodiment embodiments.
Figure 13B:
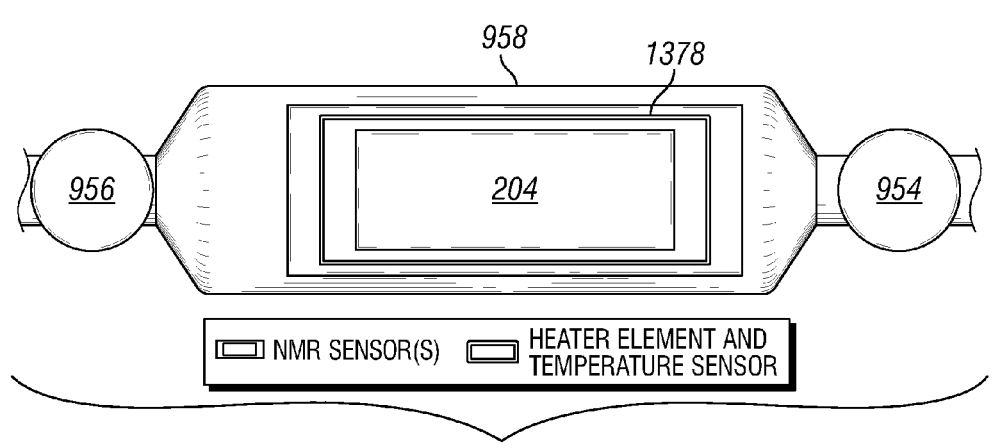

Yet another application involving fluid isolation systems and micro-NMR sensors 204 is to examine the in situ viscosity versus temperature measurement. FIGS. 13A-13B illustrate two embodiments of a micro-NMR apparatus for performing in situ measurements, according to an exemplary embodiment. As shown in FIG. 13A, the micro-NMR apparatus can include inlet and outlet isolation devices, as well as a heating element 1376 externally wrapped on a magnet 424. In other embodiments, as shown in FIG. 13B, the heating element 1378 (as well as a temperature sensor) can be inbuilt with the magnet 424—i.e., designed to be part of the magnet 424 assembly itself. Regardless of the arrangement of the magnet 424 assembly, fluid samples trapped downhole can flow into the isolation system. When in the isolation system, the fluids can then have continuous in situ diffusion, $T_1$, $T_2$, and viscosity measurements acquired versus time and/or temperature, as the temperature is altered within the chamber. These measurements can be made and/or acquired by processes similar to those used by conventional NMR sensors 204, as may be recognized by one of ordinary skill in the art having benefit of the present disclosure. This process enables the identification of fluid properties for thermal techniques such as steam flood, steam assisted gravity drainage, and secondary recovery techniques. For example, determining viscosity as a function of temperature can provide information on optimal ranges of temperatures to heat a given reservoir, especially for those that contain heavy oils.

As to the exemplary methods and steps described in the embodiments presented previously, they are illustrative, and, in alternative embodiments, certain steps can be performed in a different order, in parallel with one another, omitted entirely, and/or combined between different exemplary methods, and/or certain additional steps can be performed, without departing from the scope and spirit of the invention. Accordingly, such alternative embodiments are included in the invention described herein.

The invention can comprise a computer program that embodies the functions described herein and illustrated in the flow charts. However, it should be apparent that there could be many different ways of implementing the invention in computer or algorithmic programming, and the invention should not be construed as limited to any one set of program instructions. Further, a skilled programmer would be able to write such a program to implement an embodiment of the disclosed invention based on the flow charts and associated description in the application text. Therefore, disclosure of a particular set of program code instructions is not considered necessary for an adequate understanding of how to make and use the invention.

The invention can be used with computer hardware and software that performs the methods and processing functions described above. Specifically, in describing the functions, methods, and/or steps that can be performed in accordance with the invention, any or all of these steps can be performed by using an automated or computerized process. As will be appreciated by those skilled in the art, the systems, methods, and procedures described herein can be embodied in a programmable computer, computer executable software, or digital circuitry. The software can be stored on computer readable media. For example, computer readable media can include a floppy disk, RAM, ROM, hard disk, removable media, flash memory, memory stick, optical media, magneto-optical media, CD-ROM, etc. Digital circuitry can include integrated circuits, gate arrays, building block logic, field programmable gate arrays (FPGA), etc.

Although specific embodiments of the invention have been described above in detail, the description is merely for purposes of illustration. Various modifications of, and equivalent steps corresponding to, the disclosed aspects of the exemplary embodiments, in addition to those described above, can be made by those skilled in the art without departing from the spirit and scope of the invention defined in the following claims, the scope of which is to be accorded the broadest interpretation so as to encompass such modifications and equivalent structures.

What is claimed is:

1. An apparatus for analyzing fluid in a wellbore comprising:
    a body;
    at least one arm connected to the body; and
    a plurality of nuclear magnetic resonance sensors, wherein at least one of the plurality of nuclear magnetic resonance sensors is disposed on the at least one arm.

2. The apparatus of claim 1, wherein the body is substantially centered within the apparatus.

3. The apparatus of claim 1, wherein the body is eccentered within the apparatus.

4. The apparatus of claim 1, further comprising a permanent magnet disposed on the body.

5. The apparatus of claim 4, wherein the permanent magnet is configured to create a magnetic field spanning a region comprising the plurality of nuclear magnetic resonance sensors.

6. The apparatus of claim 1, further comprising a plurality of tubes connecting each of the plurality of nuclear magnetic resonance sensors to a sample region.

7. The apparatus of claim 6, wherein the sample region is proximate a perforation point, and wherein the plurality of nuclear magnetic resonance sensors comprises a plurality of micro-nuclear magnetic resonance sensors.

8. The apparatus of claim 1, wherein at least another one of the plurality of nuclear magnetic resonance sensors is disposed on the body.

9. The apparatus of claim 1, wherein the at least one arm is connected to the body such that is extendable and retractable with respect to the body.

10. A method for analyzing fluid in a wellbore comprising the steps of:
    placing an NMR measurement tool comprising a plurality of nuclear magnetic resonance sensors in contact with fluid from a wellbore, the plurality of nuclear magnetic resonance sensors being disposed on a body and an arm of the NMR measurement tool;
    receiving fluid in the wellbore with the NMR measurement tool;
    analyzing the fluid with the nuclear magnetic resonance sensors, wherein the step of analyzing the fluid comprises measuring a nuclear magnetic resonance characteristic of the fluid, wherein the steps of receiving the fluid in the wellbore and analyzing the fluid with the nuclear magnetic resonance sensors are performed initially at a first time and then subsequently at a second time;
    using a processor to compare the nuclear magnetic resonance characteristic measured at the first time with the nuclear magnetic resonance characteristic measured at the second time; and
    using the processor to determine at least one property of the fluid based at least partially on the analysis at the first and second times and the comparison.

11. The method of claim 10, wherein the nuclear magnetic resonance characteristic comprises a free induction decay, and wherein the plurality of nuclear magnetic resonance sensors comprises a plurality of micro-nuclear magnetic resonance sensors.

12. A method for analyzing fluid in a wellbore comprising the steps of:
    placing an NMR measurement tool comprising a plurality of nuclear magnetic resonance sensors in contact with fluid from a wellbore, the plurality of nuclear magnetic resonance sensors being disposed on a body and an arm of the NMR measurement tool;
    receiving fluid in the wellbore with the NMR measurement tool;
    analyzing the fluid with the nuclear magnetic resonance sensors, wherein the step of analyzing the fluid comprises the step of measuring a nuclear magnetic resonance characteristic of the fluid, wherein the steps of receiving the fluid in the wellbore and analyzing the fluid with the nuclear magnetic resonance sensors are performed initially at a first time, and wherein the steps of receiving fluid in the wellbore and analyzing the fluid with the nuclear magnetic resonance sensors are performed repeatedly over a period of time, thereby yielding a plurality of nuclear magnetic resonance characteristic measurements of the fluid over the period of time; and
    using a processor to determine at least one property of the fluid based on plurality of nuclear magnetic resonance characteristics measurements.

13. The method of claim 12, further comprising the step of comparing the plurality of nuclear magnetic resonance characteristics of the fluid over the period of time with each other.

14. The method of claim 12, further comprising the step of analyzing changes in the plurality of nuclear magnetic resonance characteristic measurements of the fluid over the period of time.

15. The method of claim 12, wherein the steps of receiving fluid in the wellbore and analyzing the fluid with the nuclear magnetic resonance sensors are performed repeatedly on a continuous basis.

16. The method of claim 12, wherein the steps of receiving fluid in the wellbore and analyzing the fluid with the nuclear magnetic resonance sensors are performed repeatedly in batches.

* * * * *